United States Patent
Gill et al.

(10) Patent No.: US 7,096,450 B2
(45) Date of Patent: Aug. 22, 2006

(54) ENHANCEMENT OF PERFORMANCE OF A CONDUCTIVE WIRE IN A MULTILAYERED SUBSTRATE

(75) Inventors: Jason P. Gill, Essex Junction, VT (US); David L. Harmon, Essex, VT (US); Deborah M. Massey, Jericho, VT (US); Alvin W. Strong, Essex Junction, VT (US); Timothy D. Sullivan, Underhill, VT (US); Junichi Furukawa, Pittsburgh, PA (US)

(73) Assignee: International Business Machines Corporation, Armonk, NY (US)

( * ) Notice: Subject to any disclaimer, the term of this patent is extended or adjusted under 35 U.S.C. 154(b) by 326 days.

(21) Appl. No.: 10/604,165

(22) Filed: Jun. 28, 2003

(65) Prior Publication Data

US 2004/0262031 A1    Dec. 30, 2004

(51) Int. Cl.
*G06F 17/50* (2006.01)
(52) U.S. Cl. ............................ 716/15; 716/13; 174/262
(58) Field of Classification Search .................. 716/13, 716/14, 15; 174/255, 262, 261, 260, 264
See application file for complete search history.

(56) References Cited

U.S. PATENT DOCUMENTS

| | | | |
|---|---|---|---|
| 5,614,764 A | 3/1997 | Baerg et al. ................. | 257/767 |
| 5,641,993 A | 6/1997 | Yamaha et al. .............. | 257/765 |
| 5,712,510 A | 1/1998 | Bui et al. .................... | 257/758 |
| 5,760,476 A | 6/1998 | Varker et al. ................ | 257/767 |
| 5,793,113 A | 8/1998 | Oda ............................ | 257/774 |
| 5,798,301 A | 8/1998 | Lee et al. .................... | 438/653 |
| 5,981,378 A | 11/1999 | Bothra ........................ | 438/637 |
| 5,986,218 A * | 11/1999 | Muto et al. .................. | 174/261 |
| 6,040,524 A * | 3/2000 | Kobayashi et al. ........... | 174/36 |
| 6,096,637 A | 8/2000 | Sriram ........................ | 439/643 |
| 6,191,481 B1 | 2/2001 | Bothra ........................ | 257/734 |
| 6,320,391 B1 | 11/2001 | Bui ............................. | 324/537 |
| 6,388,269 B1 | 5/2002 | Saito ........................... | 257/48 |
| 2001/0001427 A1 | 5/2001 | Atakov et al. ............... | 174/113 |
| 2002/0038911 A1 | 4/2002 | Graas et al. ................. | 257/763 |
| 2002/0100984 A1 | 8/2002 | Oshima et al. .............. | 257/774 |
| 2002/0107675 A1 | 8/2002 | Shinzawa ..................... | 703/2 |

OTHER PUBLICATIONS

IBM Technical Disclosure Bulletin, vol. 14, No. 2, Jul. 1971, Increasing Resistance to Electromigration in Thinmetal Films, Berenbaum, pp. 601-602.

* cited by examiner

*Primary Examiner*—Kamand Cuneo
*Assistant Examiner*—Ishwar (I. B.) Patel
(74) *Attorney, Agent, or Firm*—Schmeiser, Olsen & Watts; William D. Sabo

(57) ABSTRACT

An electronic structure having wiring, and an associated method of designing the structure, for limiting a temperature gradient in the wiring. The electronic structure includes a substrate having a layer that includes a first and second wire which do not physically touch each other. The first and second wires are adapted to be at an elevated temperature due to Joule heating in relation to electrical current density in the first and second wires. The first wire is electrically and thermally coupled to the second wire by an electrically and thermally conductive structure that exists outside of the layer. The width of the second wire is tailored so as to limit a temperature gradient in the first wire to be below a threshold value that is predetermined to be sufficiently small so as to substantially mitigate adverse effects of electromigration in the first wire.

18 Claims, 7 Drawing Sheets

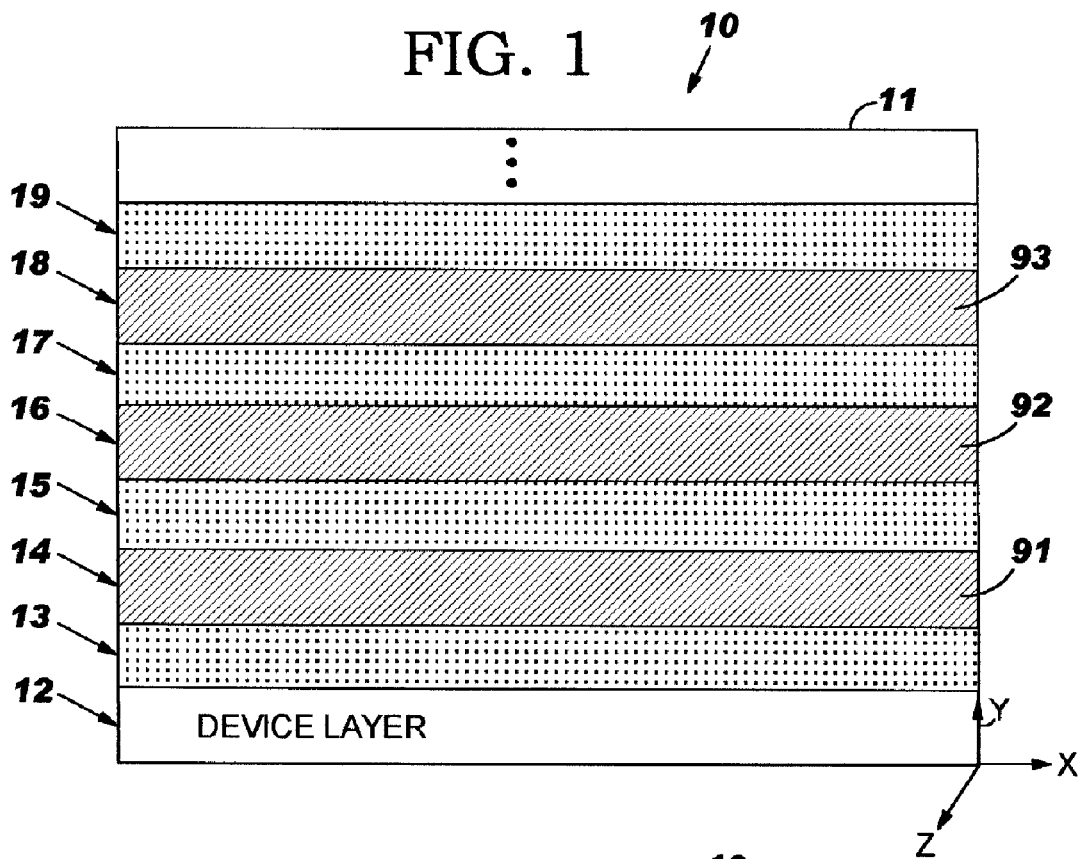
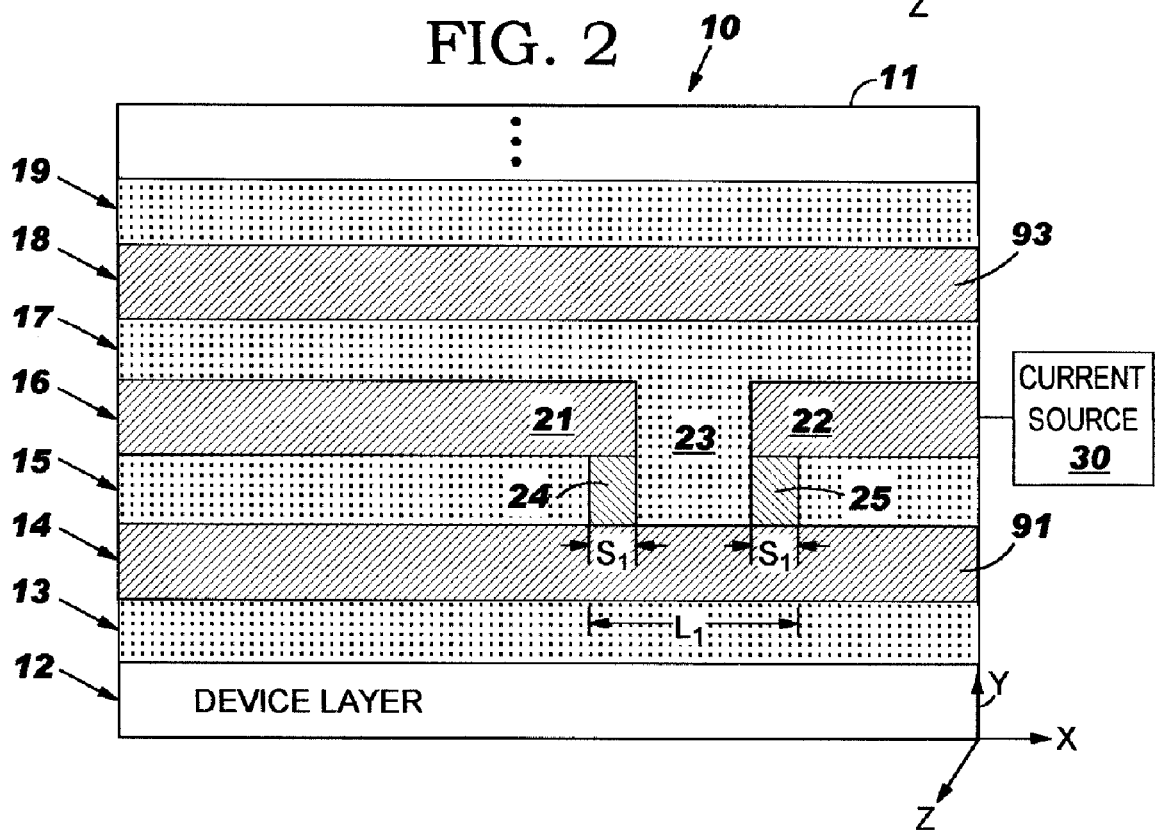

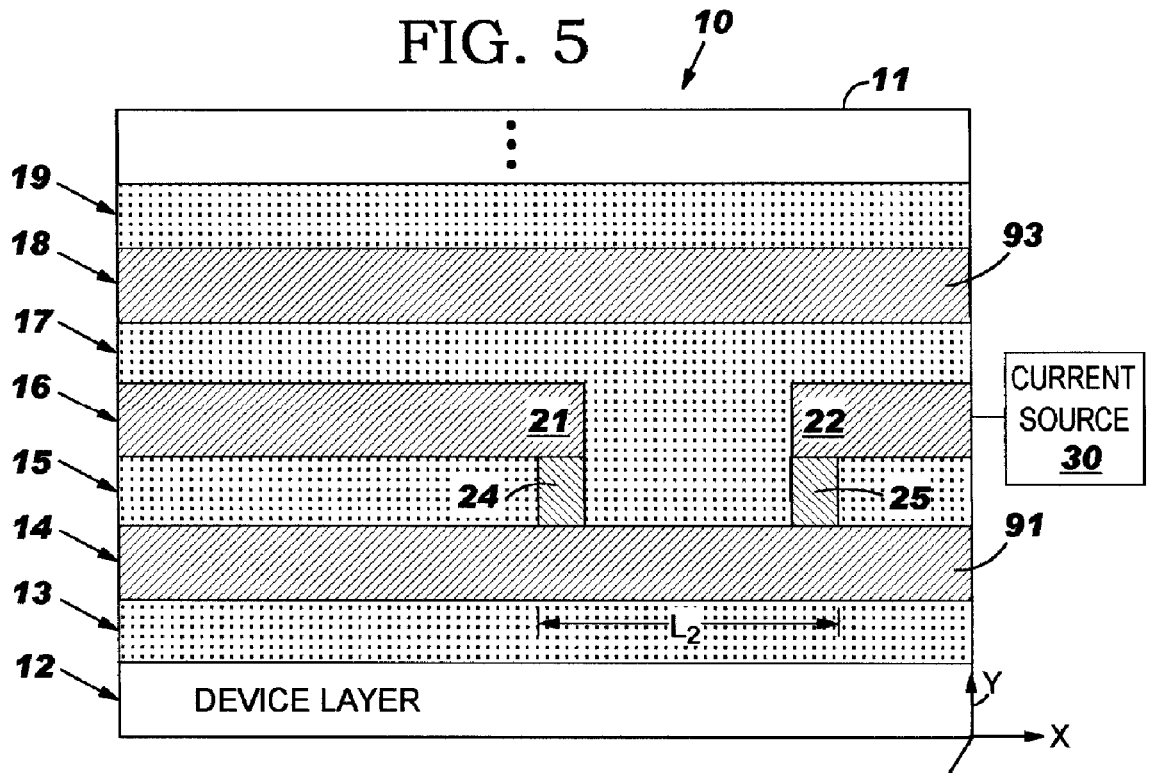
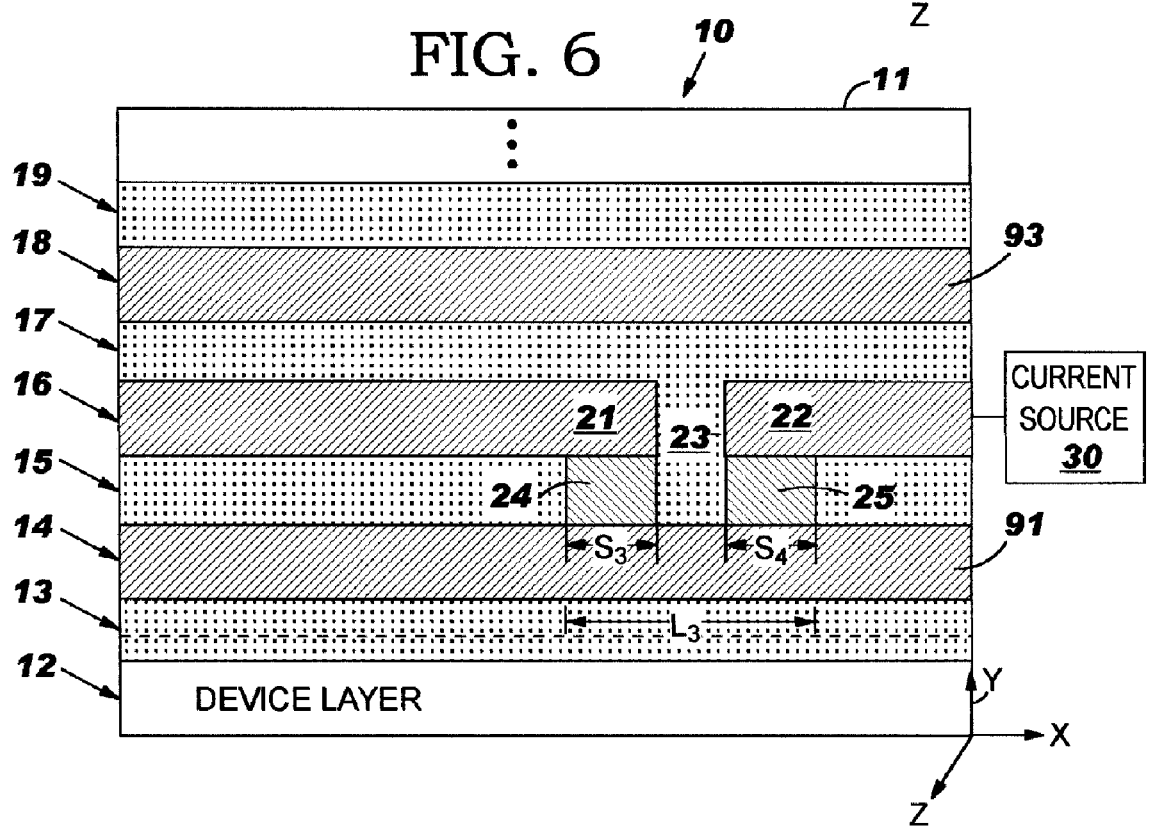

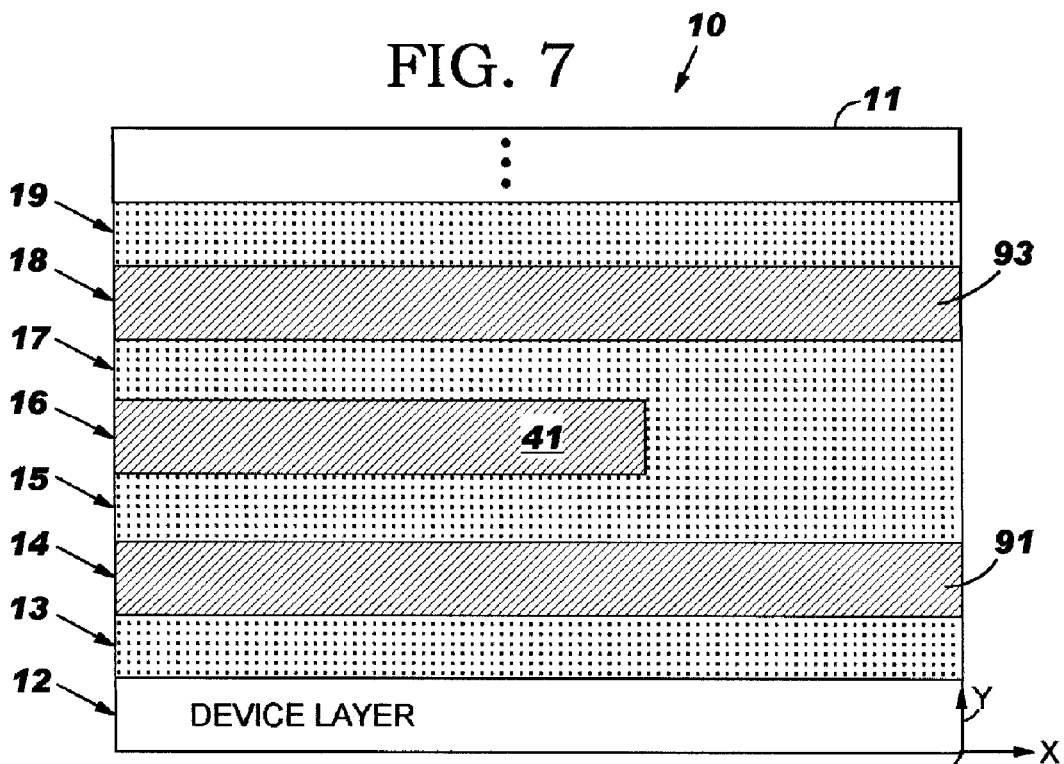
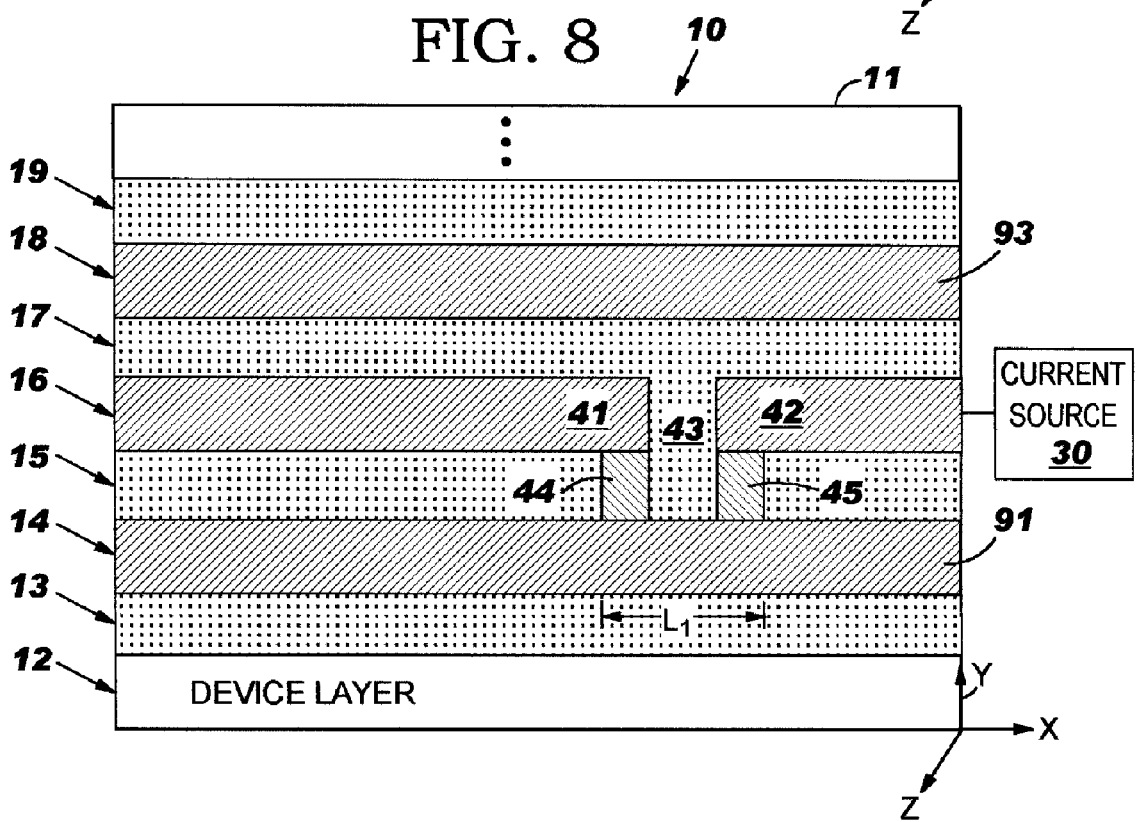

ENHANCEMENT OF PERFORMANCE OF A CONDUCTIVE WIRE IN A MULTILAYERED SUBSTRATE

BACKGROUND OF INVENTION

1. Technical Field

The present invention relates to an electronic structure having a wiring pattern and method of designing the wiring pattern so as to control the temperature distribution in a portion of the wiring pattern

2. Related Art

Electromigration due to an electric current in a conductive wire causes current-induced atomic diffusion due to momentum transfer from flowing electrons to host atoms, or a diffusion of electrons in electric fields set up in the wire while the circuit is in operation. Electromigration may cause connections at the end of the wire to degrade. For example, the interconnect may separate from an adjacent via, causing an opening or void in the circuit. In addition, metal at the end of the wire may form extrusions which may cause short-circuiting. Electromigration reliability is measured in terms of mean time to failure (MTF), which is defined as an increase in electrical resistance by a prescribed amount (e.g., 10%) for certain length and width interconnects at an assumed temperature with the application of a constant current density. The temperature may be in a range of 250° to 350° C., and the constant current density may be in a range of 20 to 30 mA/µm².

Electromigration tests at the package-level are usually performed at a moderate current density (e.g., 20 to 30 mA/µm2) in an oven at a high temperature (e.g., 250 to 300° C.). Electronic structures in these package-level tests are stressed until they reach a certain failure criterion (e.g., 10 to 500 hours) such as a 10% increase in electrical resistance. In performing package-level tests, the time and cost to dice and package the wafers must also be taken into consideration. In these tests, the current density is small enough, so very little Joule heating occurs, eliminating the concern of temperature gradients. At the wafer level, however, Joule heating is used to raise the wire's temperature (e.g., 350–450° C.), which requires a very high current density (e.g., 400 mA/µm2). This method produces undesirable failure modes.

Accordingly, there is a need for an electronic structure having a multilayered substrate and a wiring pattern therein, together with an associated method of designing the wiring pattern, which avoids the undesirable failure modes for wires of the wiring pattern for an assumed current density.

SUMMARY OF INVENTION

The present invention provides a method for designing wiring in a multilayered substrate so as to limit a temperature gradient in said wiring, comprising the steps of:

providing an initial wiring design in which the multilayered substrate comprises layers stacked in a Y direction, wherein each layer of said layers has its length oriented in a X direction that is orthogonal to the Y direction, wherein a first electrically conductive wire within a first layer of said layers has its length oriented in the X direction, wherein in the initial wiring design the first wire has a spatially non-uniform temperature distribution T(X) along its length for an assumed current density J1 in the first wire such that the first wire has a mean time to failure MTF1 at the current density J1; and altering the initial wiring design to reduce the magnitude of a temperature gradient dT(X)/dX along the length of the first wire for a current density J2 not less than J1 in the first wire, wherein the altering does not include changing a cross sectional area of the first wire, wherein the altering includes electrically and thermally coupling the first wire to a second electrically conductive wire in the first layer by an electrically and thermally conductive structure that exists outside of the first layer and adjusting the width distribution of the second wire in a Z direction that is orthogonal to the X and Y directions, wherein the first and second wires do not physically touch each other, and wherein said adjusting controls a temperature in the second wire so as to cause the second wire to act as a heat source or heat sink to the first wire.

The present invention provides an electronic structure for limiting a temperature gradient in wiring within a multilayered substrate, said electronic structure comprising a multilayered substrate having layers stacked in a Y direction, wherein each layer of said layers has its length oriented in a X direction that is orthogonal to the Y direction, wherein first and second electrically conductive wires within a first layer of said layers have their respective lengths oriented in the X direction, wherein the first wire is electrically and thermally coupled to the second wire by an electrically and thermally conductive structure that exists outside of the first layer, wherein the first and second wires do not physically touch each other, wherein the first wire is adapted to have a temperature distribution T(X) along its length at a given current density J in the first wire, wherein a width distribution of the second wire in a Z direction that is orthogonal to the X and Y directions is tailored so as to limit the temperature gradient dT(X)/dX to be below a real positive number, for all values of X, and wherein, is predetermined to be sufficiently small so as to substantially mitigate adverse effects of electromigration in the first wire.

The present invention advantageously provides a multilayered substrate and a wiring pattern therein, together with an associated method of designing the wiring pattern, which avoids undesirable failure modes for wires of the wiring pattern for an assumed current density.

BRIEF DESCRIPTION OF DRAWINGS

FIG. 1 depicts a design of a front cross-sectional view of a multilayered substrate having a device layer, a first wire above the device layer, a second wire above the first wire, and a third wire above the second wire, in accordance with embodiments of the present invention.

FIG. 2 depicts the design of FIG. 1 after the second wire has been subdivided into a test wire and a supply wire, the test wire and supply wire each being coupled by a respective via to the first wire, in accordance with embodiments of the present invention.

FIG. 5 depicts the design of FIG. 2 with the first wire having a different effective length as compared with the corresponding effective length of the first wire in FIG. 2, in accordance with embodiments of the present invention.

FIG. 6 depicts the design of FIG. 2 with the vias having different lengths as compared with the corresponding via lengths in FIG. 2, in accordance with embodiments of the present invention.

FIG. 7 depicts the design of FIG. 1 with the second wire serving as a test wire and having a shorter length than the second wire in FIG. 1, in accordance with embodiments of the present invention.

FIG. 8 depicts the design of FIG. 7 after a supply wire has been added, the test wire and supply wire each being coupled by a respective via to the second wire, in accordance with embodiments of the present invention.

DETAILED DESCRIPTION

Figure 3A:
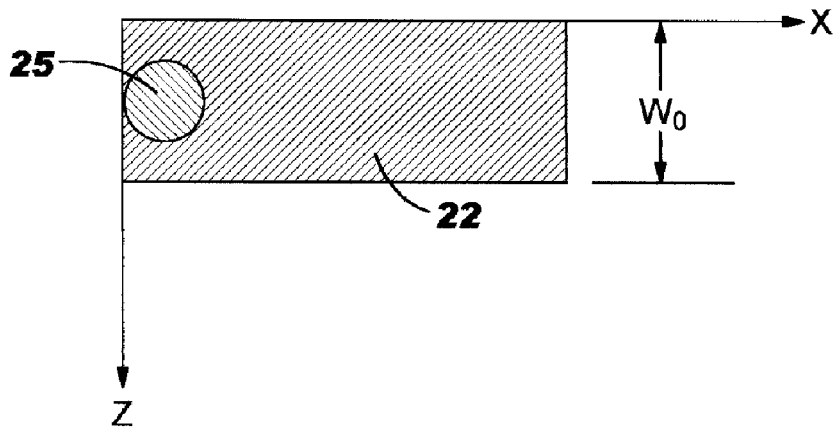
FIGS. 3A–3C depicts the supply wire of FIG. 2 having different widths, in accordance with embodiments of the present invention.

In electromigration testing, use may be made of the mean time to failure (MTF) given by Black's equation from experimental data at high stress temperatures. The MTF values may be projected to specific operating conditions, by calculating the activation energy (Ea) and current acceleration factor (n). Black's equation, in terms of Ea and n, is given by:

$$MTF = AJ^{-n} \exp(Ea/kT)$$

where A is a constant, J is electric current density, k is the Boltzmann constant, and T is absolute temperature. Issues relating to wafer-level lifetime prediction accuracy arise from the use of MTF in Black's Equation, which depends on temperature but is independent of temperature gradients. Temperature gradients can have a large effect on lifetime when testing at high current density, which is used for wafer-level testing. Voids nucleate where there is a positive temperature gradient, while hillocks form where there is a negative temperature gradient. Void formation due to temperature gradients could cause a faster fail than predicted by Black's equation. Voids are more likely to nucleate where there is a temperature gradient, because at higher temperatures the atomic flux is higher. At a temperature gradient, metal ions in a wire at the higher temperature will leave faster than they are replaced by ions from the wire at the lower temperature. This results in an increased concentration of vacancies. When the vacancy concentration reaches some critical value, voids may form leading to an open circuit and line failure. Thus, electromigration effects and consequent wiring fails, caused by temperature gradients in an electrically conductive line, are problematic.

The present invention discloses a novel structure that can be designed in such a manner as to control the temperature gradient of an electrically conducting line built in a multi-layered substrate such as in conjunction with the metallurgy of the semiconductor industry. A design methodology to keep the test line temperature gradient nearly constant will be given. This methodology will demonstrate how to calculate the appropriate supply line dimensions given an applied current and the test line dimensions. Through much experimentation and simulation, the inventors of the present invention have demonstrated that a supply line either on the conducting level above or below the test line cannot come close to providing conditions that will allow the test line to be at a nearly constant temperature gradient at high currents. The unique test structure of the present invention provides the capability of a nearly constant temperature profile across a test line that is generated by Joule heating. In addition, this same methodology could be used to maximize or minimize the thermal gradient at the end of an electrically conductive line. The present invention advantageously avoids the adverse effect of electromigration without having to make a major redesign of the wiring layout or of the processing in relation to the wiring layout. For example, the present invention discloses how to make wiring design changes to reduce temperature gradients in a current-carrying wire without changing a cross sectional area of the current-carrying wire.

FIG. 1 depicts, in an XYZ rectangular coordinate system, an initial design of a front cross-sectional view of a multi-layered substrate 10 having layers 12–19 sequentially ordered in the Y direction from bottom surface 9 to top surface 11 of the substrate 10, in accordance with embodiments of the present invention. The cross-sectional view of FIG. 1 is in the X-Y plane defined by X and Y directions as shown, wherein the X and Y directions are mutually orthogonal. The Z direction in FIG. 1 is orthogonal to both the X and Y directions. The positive X, Y, and Z directions are in the directions pointed to by the arrow on the X axis, Y axis, and Z axis, respectively, in FIG. 1. The substrate 10 may comprise, inter alia, an integrated circuit. Layer 12 is a device layer which may include semiconductor material (e.g., silicon, germanium, etc.,). The device layer 12 may comprise, inter alia, electronic devices (including semiconductor devices) such as field effect transistors (FETs), bipolar transistors, capacitors, resistors, diodes, etc. Layers 13, 15, 17, and 19 each comprise dielectric material such as, inter alia, $SiO_2$ or the like, sputtered quartz or the like, etc. Layer 14 comprises an electrically conductive wire 91 (e.g., a tungsten wire). Layer 16 comprises an electrically conductive wire 92 (e.g., a copper or aluminum wire). The wire 92 may be a test line that will be modified as shown in FIG. 2 and discussed infra. In FIG. 1, layer 18 comprises an electrically conductive wire 93 (e.g., a copper or aluminum wire). While FIG. 1 shows layer 12 as a device layer, the present invention includes the case in which layer 12 is not a device layer, since such a device layer may exist elsewhere in the substrate 10 (e.g., above layer 19) or be absent.

The wires 91, 92, and 93 (and any other wires within the substrate 10 discusssed infra) may each have any of a variety of distributions of conductive materials such, inter alia, as a metallic line or a layered structure comprising a metallic line sandwiched between metallic plates on opposing sides of the metallic line. Representative conductive materials comprised by the metallic line include, inter alia, copper, aluminum, refractory metals (e.g., tungsten), and alloys thereof. Representative conductive materials comprised by the metallic plates include, inter alia, titanium nitride, tantalum, tantalum nitride, and alloys thereof.

The lifetime of wire 92 is characterized by the mean time to failure (MTF) of wire 92 at an assumed current density in the wire 92. In the wiring configuration of FIG. 1, the wire 92 is subject to thermal gradients in the X direction at sufficiently high electrical currents flowing through the wire 92, which potentially lead to adverse MTF performance of the wire 92. As discussed infra in conjunction with FIGS.

2–11, the present invention is directed to improving the MTF performance of the wire 92 such as by, inter alia: 1) increasing the current carrying capability (i.e., current density) of the wire 92 for a given MTF of the wire 92; or 2) increasing the MTF of the wire 92 for a given current density in the wire 92. The basic technique is directed to essentially eliminating, or substantially reducing, temperature gradients along the length of the wire 92 in the X direction. Thus if in FIG. 1, the wire 92 has a MTF of MTF1 at an assumed current density of J1 in the X direction, then the present invention is directed to altering the wiring design in the substrate 10 (as described infra in FIGS. 2–11) so as to make the temperature distribution of the wire 92 essentially or substantially uniform in the X direction such that in the improved wiring design, the wire 92 has a MTF of MTF2 at an assumed current density of $J_2$ in the X direction, wherein $J_2 \# J_1$. In one embodiment, $J_2$ exceeds $J_1$ and MTF2 is essentially unchanged from MTF1. In another embodiment, $J_2$ is about equal to $J_1$, and MTF2 exceeds MTF1.

The present invention is applicable to a test design environment as well to actual product usage. Thus, although the term test line or test wire is employed infra to describe a portion of the wire 92, all features and results relating to said test line or test wire, as described herein, is generally applicable to an electrically conductive line in either a design test environment or in an actual product environment. In the design test environment, the test line is tested to determine the maximum electric current or current density the test line can carry and not fail under use conditions.

FIG. 1 (as well as FIG. 7, discussed infra) depicts an initial design. FIGS. 2–6 and 8–10 depict alterations in the initial design in accordance with unique heat control design (U.H.C.) structures.

FIG. 2 depicts the design of FIG. 1 after removal (in the design process) of a portion of the wire 92, leaving remaining wires 21 and 22 with intervening dielectric material 23 between wires 21 and 22, in accordance with embodiments of the present invention. Wire 21 is a test wire (which may be employed in a test environment or in a product environment as stated supra) and wire 22 is a supply wire electrically connected to a current source 30. Thus the current source 30 supplies electric current to the wire 22, and the wire 22 supplies electric current to the wire 21. Conductive vias 24 and 25 have been added to the design, although the scope of the present invention includes the case in which vias 24 and 25 are present in the initial design of FIG. 1. The wire 21 is electrically and thermally coupled to the wire 91 by means of via 24, and the wire 22 is electrically and thermally coupled to the wire 91 by means of via 25. Thus, the following electrically conductive and thermally conductive path has been established: wire 22 to via 25 to an effective length of wire 91 to via 24 to wire 21. Electrical wiring (not shown) connected to the wire 21 is electrically routed outside of the substrate 10 through an external electrically conductive path that terminates at the current source 30 to form a closed electrical loop.

The effective length of wire 91 in FIG. 2 is the portion of wire 91 that is within the thermally conductive path from wire 22 to wire 21 and is denoted in FIG. 2 as the length L1 in the X direction. In some embodiments, the wire 91 may exist in the X direction only directly under the dielectric material 23 and vias 24 and 25 within the length L1 and thus have a total length that is equal to or less than $L_1$.

The vias 24 and 25 have lengths of $S_1$ and $S_2$, respectively, in the X direction. Said vias 24 and 25 (and any other vias discussed infra) may have various distributions of conductive materials such as, inter alia, a metallic plug or a metallic plug circumscribed by a metallic liner. Representative conductive materials comprised by the metallic plug include, inter alia, copper, aluminum, tungsten and alloys thereof. Representative conductive materials comprised by the metallic liner include, inter alia, refractory metals or alloys thereof (e.g., titanium, titanium nitride, tantalum, tantalum nitride).

In FIG. 2, temperature gradients in the wire 21 in the X direction are a function of the temperature differential between the wire 91 and the wire 21. For example, if the wire 91 includes tungsten and the wire 21 includes aluminum (or copper), then the wire 91 will be at a higher temperature than will the wire 21 for a current density in wire 91 that is equal to or greater than the current density in wire 21, because tungsten has a higher resistivity than aluminum (or copper) and therefore experiences a higher Joule heating rate than does aluminum (or copper). In the preceding situation, there will be a positive temperature gradient (dT/dX) in the X direction in the wire 21 where T(X) represents the temperature of the wire 21 as a function of X, with the highest values of dT/dX occurring at and near the interface between the wire 21 and the via 24. For the preceding situation of dT/dX>0 in the wire 21, the magnitude of dT/dX in the wire 21 may be substantially lowered or essentially eliminated if a heat sink could be established that extracts heat from the wire 21 or prevents heat generated by the wire 91 from being conducted into the wire 21. Thus in embodiments of the present invention characterized by dT/dX>0, the wire 22 functions as a heat sink to the wire 21 (see, e.g., FIG. 3B and the discussion thereof infra), and in such embodiments characterized by dT/dX>0 the electrical resistivity of the wire 21 may be less than the electrical resistivity of the wire 91.

If the opposite situation should occur in which the wire 91 is at a lower temperature than the wire 21, then dT/dX<0 in the wire 21 particularly at and near the interface between the wire 21 and the via 24. For the preceding situation of dT/dX<0 in the wire 21, the magnitude of dT/dX in the wire 21 may be substantially lowered or essentially eliminated if a heat source could be established that adds heat to the wire 21 or inhibits heat conduction from the wire 21 into the wire 91. The present invention presents various structures and associated methods for generating such heat sinks and sources as needed to essentially eliminate or substantially reduce the magnitude of temperature gradients dT/dX in the wire 21. Thus in embodiments of the present invention characterized by dT/dX<0, the wire 22 functions as a heat source to the wire 21 (see, e.g., FIG. 3C and the discussion thereof infra), and in such embodiments characterized by dT/dX<0 the electrical resistivity of the wire 21 may exceed the electrical resistivity of the wire 91.

In some embodiments, the wire 91 may exist in the X direction only between the outer surfaces of vias 24 and 25 within the effective length L1 such that the wire 91 has a total length that is equal to or less than the effective length $L_1$.

Figure 3B:
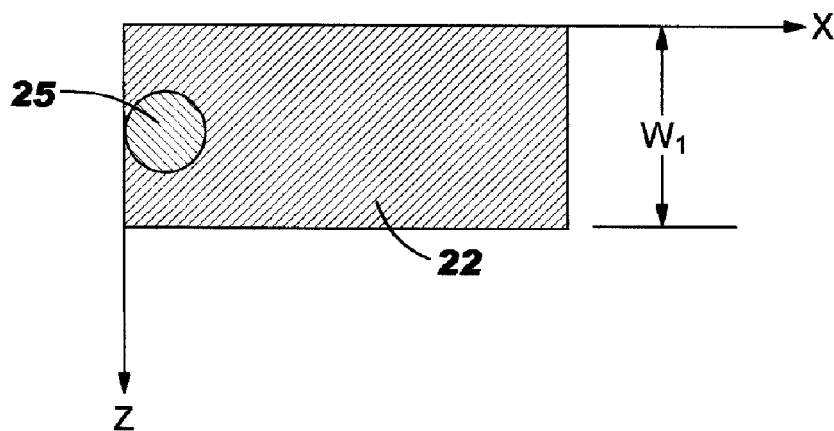
Figure 3C:
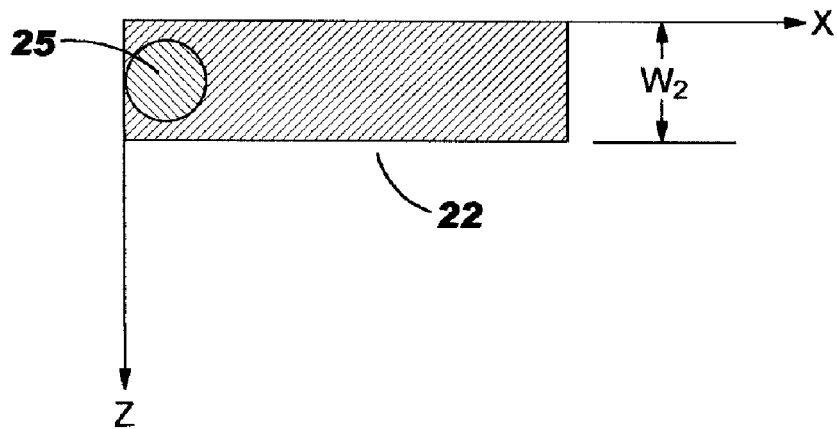

FIGS. 3A–3C depict the wire 22 of FIG. 2 having different widths in the Z direction, in accordance with embodiments of the present invention. In FIG. 3A, the width W0 of the wire 22 is assumed to be the same as in FIG. 2.

In FIG. 3B assuming dT/dX>0 in the wire 21, the width W1 of the wire 22 exceeds W0, which enables the wire 22 to function as a heat sink to the wire 21 for the following reason. With W1>W0, the cross-sectional area for current flow in the wire 22 is increased, which reduces the current density in the wire 22, which lowers the Joule heating in the wire 22, which reduces the temperature in the wire 22, which reduces the temperature in the wire 21. Therefore, the temperature in the wire 22 could be lowered to a desired value by choosing a sufficiently large value of the width $W_1$ relative to $W_0$, provided that sufficient space is available in the layer 16 to accommodate the desired value of $W_1$. By so lowering the temperature of the wire 22, the temperature of the effective length (i.e., within length $L_1$) of the wire 91 is correspondingly lowered through thermally conductive coupling between the wires 22 and 91 by means of the thermally conductive via 25. Said lowering of the temperature of the effective length of the wire 91, extracts heat from (or reduces the addition of heat to) the wire 21 at and near the interface between the wire 21 and the via 24, which has the effect of essentially eliminating or substantially reducing the magnitude of the positive temperature gradient $dT/dX$ in the wire 21.

In FIG. 3C assuming $dT/dX<0$ in the wire 21, the width $W_2$ of the wire 22 is less than $W_0$, which enables the wire 22 to function as a heat source to the wire 21 for the following reason. With $W_2<W_0$, the cross-sectional area for current flow in the wire 22 is decreased, which increases the current density in the wire 22, which increases the Joule heating in the wire 22, which increases the temperature in the wire 22, which increases the temperature in the wire 21. Therefore, the temperature in the wire 22 could be increased to a desired value by choosing a sufficiently small value of the width $W_2$ relative to $W_0$. By so increasing the temperature of the wire 22, the temperature of the effective length (i.e., within length $L_1$) of the wire 91 is correspondingly increased through thermally conductive coupling between the wires 22 and 91 by means of the thermally conductive via 25. Said increasing of the temperature of the effective length of the wire 91 adds heat to the wire 21 at and near the interface between the wire 21 and the via 24, which has the effect of essentially eliminating or substantially reducing the magnitude of negative temperature gradients $dT/dX$ in the wire 21.

The preceding discussion of FIGS. 3A–3C illustrates that the width of the wire 22 may be used as an effective and convenient mechanism to control the temperature distribution $T(X)$ and the temperature gradient $dT(X)/dX$ of the wire 21. Accordingly, said mechanism may be used to significantly increase the MTF of the wire 21 at the current density $J_2$ or to constrain the MTF of the wire 21 at the current density $J_2$ to be about maximal with respect to variations in the width of the wire 22.

While FIGS. 3A–3C depict the width of the wire 22 in the Z direction as being constant, said width of the wire 22 may alternatively be a function $W(X)$ of X, wherein $W(X)$ may be a continuous function of X or a discontinuous function of X (e.g., a step function of X). Although the wire 22 is shown in FIGS. 3A–3C as being a continuous distribution of conductive material in the X-Z plane, the present invention also includes an embodiment in which the wire 22 is distributed discretely in accordance with a two-dimensional grid in the X-Z plane, such that $W(X)$ is a discrete function of X in accordance with said grid. The actual distribution of conductive material of the wire 22 (as reflected in $W(X)$) impacts the temperature of the wire 22 in two ways. First, $W(X)$ impacts the current density in the wire 22 which control the rate of heat generation in the wire 22. Second, $W(X)$ impacts both the thermal conductance of the wire 22 and the available heat transfer surface area which controls the rate of heat transfer and heat dissipation from the wire 22. Thus by varying the width $W(X)$ of the wire 22, the temperature of the wire 22 may be correspondingly controlled so as to essentially eliminate or substantially reduce the magnitude of the temperature gradients $dT/dX$ in the wire 21 temperature as desired.

Figure 4A:
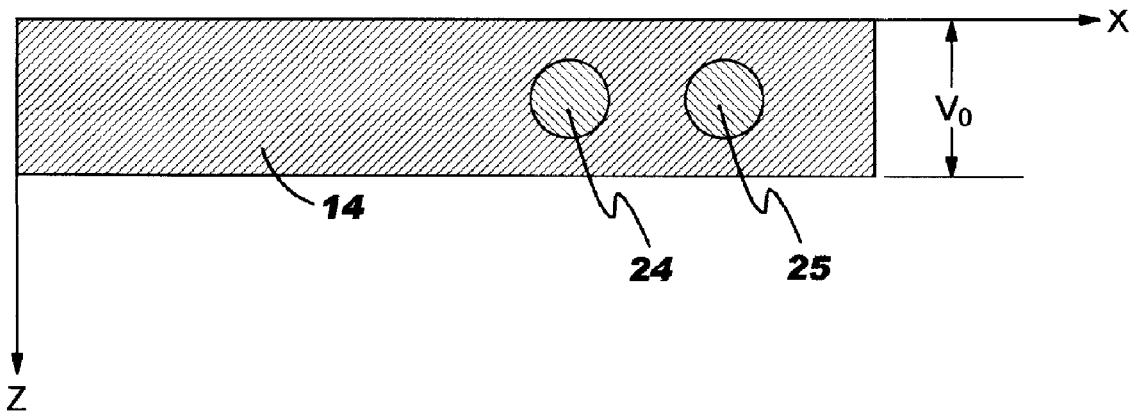
FIGS. 4A–4C depicts the first wire of FIG. 2 having different widths, in accordance with embodiments of the present invention.
Figure 4B:
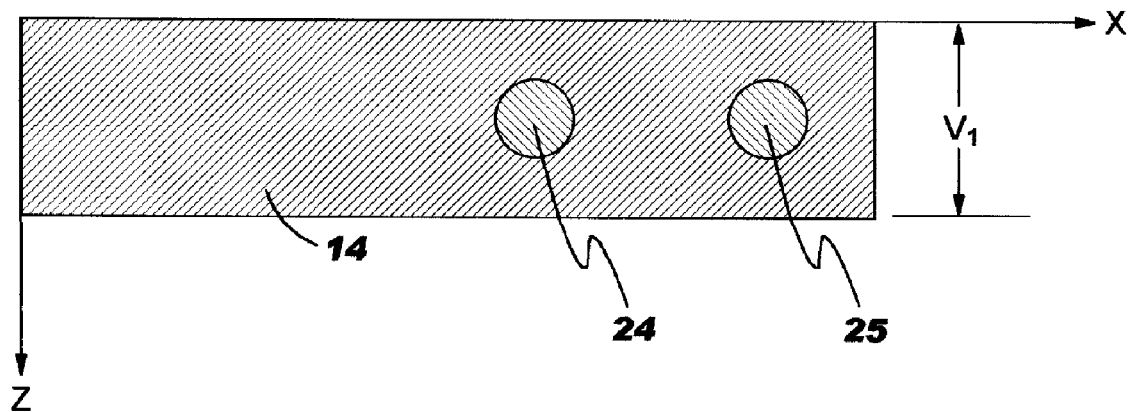
Figure 4C:
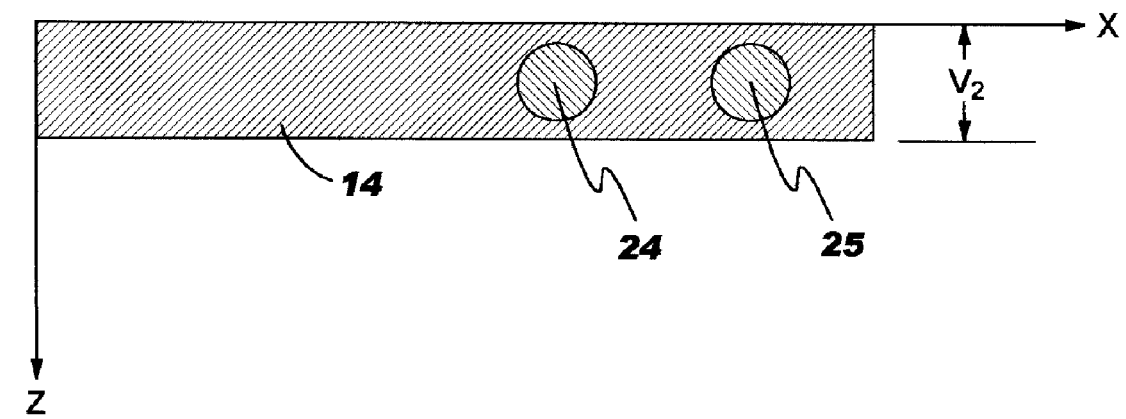

FIGS. 4A–4C depict the wire 91 in layer 14 of FIG. 2 having different widths in the Z direction, in accordance with embodiments of the present invention. In FIG. 4A, the width V0 of the wire 91 is the same as in FIG. 2.

In FIG. 4B assuming $dT/dX>0$ in the wire 21, the width $V_1$ of the wire 91 exceeds $V_0$, which lowers the temperature in the wire 91 for the following reasons. With $V_1>V_0$, the cross-sectional area for current flow in the wire 91 is increased, which reduces the current density in the wire 91, which lowers the Joule heating in the wire 91, which reduces the temperature in the effective length of the wire 91. Additionally, $V_1>V_0$ increases the heat transfer area (for heat dissipation) of the wire 91 which additionally lowers the temperature of the wire 91. Therefore, the temperature in the effective length of the wire 91 could be lowered to a desired value by choosing a sufficiently large value of the width $V_1$ relative to $V_0$, provided that sufficient space is available in the layer 14 to accommodate the desired value of V1. Said lowering of the temperature of the effective length of the wire 91 extracts heat from (or reduces the addition of heat to) the wire 21 at and near the interface between the wire 21 and the via 24, which has the effect of essentially eliminating or substantially reducing the magnitude of the positive temperature gradients $dT/dX$ in the wire 21.

In FIG. 4C assuming $dT/dX<0$ in the wire 21, the width $V_2$ of the wire 91 is less than $V_0$, which increases the temperature in the wire 91 for the following reasons. With $V_2<V_0$, the cross-sectional area for current flow in the wire 91 is decreased, which increases the current density in the wire 91, which increases the Joule heating in the wire 91, which increases the temperature in the effective length of the wire 91. Additionally, $V_2<V_0$ decreases the heat transfer area (for heat dissipation) of the wire 91 which additionally increases the temperature of the effective length of the wire 91. Therefore, the temperature in the effective length of the wire 91 could be increased to a desired value by choosing a sufficiently small value of the width $V_2$ relative to V0. Said increases of the temperature of the effective length of wire 91 adds heat to (or removes less heat from) the wire 21 at and near the interface between the wire 21 and the via 24, which has the effect of essentially eliminating or substantially reducing the magnitude of the negative temperature gradients $dT/dX$ in the wire 21.

While FIGS. 4A–4C depict the width of the wire 91 in the Z direction as being constant, said width of the wire 91 may alternatively be a function $V(X)$ of X, wherein $V(X)$ may be a continuous function of X or a discontinuous function of X (e.g., a step function of X). Although the wire 91 is shown in FIGS. 4A–4C as being a continuous distribution of conductive material in the X-Z plane, the present invention also includes an embodiment in which the wire 91 is distributed discretely in accordance with a two-dimensional grid in the X-Z plane, such that $V(X)$ is a discrete function of X in accordance with said grid. The actual distribution of conductive material of the wire 91 (as reflected in $V(X)$) impacts the temperature of the wire 91 in two ways. First, $V(X)$ impacts the current density in the wire 91 which control the rate of heat generation in the wire 91. Second, $V(X)$ impacts both the thermal conductance of the wire 91 and the available heat transfer surface area which controls the rate of heat transfer and heat dissipation from the wire 91. Thus by varying the width $V(X)$ of the wire 91, the temperature of the wire 91 may be correspondingly controlled so as to essentially eliminate or substantially reduce the magnitude of the temperature gradients dT/dX in the wire 21 temperature as desired.

FIG. 5 depicts the design of FIG. 2 with the wire 91 having a different effective length $L_2$ as compared with the corresponding effective length $L_1$ of the wire 91 in FIG. 2, in accordance with embodiments of the present invention. While FIG. 5 illustrates $L_2 > L_1$, the scope of the present invention also includes the embodiment of $L_2 < L_1$. In some embodiments, the wire 91 may exist in the X direction only between the outer surfaces of vias 24 and 25 within the effective length $L_2$ such that the wire 91 has a total length that is equal to or less than the effective length $L_2$.

The effect on the temperature of the effective length of the wire 91 due to changing the effective length of the wire 91 depends on a balance of two opposing factors. For example, if $L_2 > L_1$ then the increase in the effective length of the wire 91 increases the rate of Joule heat generation in the wire 91 since the electrical resistance of the effective length of the wire 91 is proportional to the effective length of the wire 91. On the other hand if $L_2 > L1$, the increase in the effective length of the wire 91 increases the heat transfer area for heat dissipation from the wire 91. Therefore, the effect of an increase or decrease in the effective length of the wire 91 on the direction (positive or negative) of the change in the temperature of the effective length of the wire 91 needs to be evaluated for each case, or group of similar cases, studied. Depending on the outcome of such a study, the effective length of the wire 91 may be increased or decreased as needed to provide the desired direction and magnitude of the temperature change in the effective length of the wire 91 so as to extract heat from (or add heat to) the wire 21 at and near the interface between the wire 21 and the via 24, to essentially eliminate or substantially reduce the magnitude of a positive or negative temperature gradients dT/dX in the wire 21.

FIG. 6 depicts the design of FIG. 2 with the vias 24 and 25 which have lengths of $S_3$ and $S_4$, respectively, in the X direction as compared with the lengths $S_1$ and $S_2$, respectively, in FIG. 2.

Although FIG. 6 depicts $S_3 > S_1$ and $S_4 > S_2$, the present invention also permits $S_3 \# S_1$ and $S_4 \# S_2$.

In FIG. 6 assuming dT/dX>0 in the wire 21, modifying the lengths of the vias 24 and 25 such that $S_3 > S_1$ and $S_4 > S_2$ enables the vias 24 and 25 to reduce heat input to the wire 21 for the following reason. With $S_3 > S_1$ and $S_4 > S_2$, the cross-sectional area for current flow in the vias 24 and 25 is increased, which reduces the current density in the vias 24 and 25, which lowers the Joule heating in the vias 24 and 25, which reduces the temperature in the vias 24 and 25. Therefore, the temperature in the vias 24 and 25 could be lowered to a desired value by choosing a sufficiently large value of the via lengths S3 and S4 in relation to S1 and S2, respectively, provided that sufficient space is available in the layer 15 to accommodate the desired values of $S_3$ and $S_4$. By so lowering the temperature of the vias 24 and 25, heat is extracted from the wire 21 (or less heat is added to the wire 21) at and near the interface between the wire 21 and the via 24, which has the effect of essentially eliminating or substantially reducing the magnitude of the positive temperature gradients dT/dX in the wire 21.

In FIG. 6 assuming dT/dX<0 in the wire 21, modifying the lengths of the vias 24 and 25 such that $S_3 < S_1$ and $S_4 < S_2$ enables the vias 24 and 25 to increase heat input to the wire 21 for the following reason. With $S_3 < S_1$ and $S4 < S_2$, the cross-sectional area for current flow in the vias 24 and 25 is decreased, which increases the current density in the vias 24 and 25, which increases the Joule heating in the vias 24 and 25, which increases the temperature in the vias 24 and 25. Therefore, the temperature in the vias 24 and 25 could be increased as desired by choosing a sufficiently small value of the via lengths $S_3$ and $S_4$ in relation to $S_1$ and $S_2$. By so increasing the temperature of the vias 24 and 25, heat is added to the wire 21 (or less heat is removed from the wire 21) at and near the interface between the wire 21 and the via 24, which has the effect of essentially eliminating or substantially reducing the magnitude of the negative temperature gradients dT/dX in the wire 21.

In FIG. 6, the wire 91 has an effective length $L_3$. In some embodiments, the wire 91 may exist in the X direction only between the outer surfaces of vias 24 and 25 within the effective length $L_3$ such that the wire 91 has a total length that is equal to or less than the effective length $L_3$.

Although FIG. 6 shows only the one via 24 between wires 21 and 91, the scope of the present invention generally include one or more such vias between wires 21 and 91, and the number of such vias could be varied instead of or in addition to length(s) of said vias. Similarly, although FIG. 6 shows only the one via 25 between wires 22 and 91, the scope of the present invention generally include one or more such vias between wires 22 and 91, and the number of such vias could be varied instead of or in addition to length(s) of said vias.

FIG. 7 depicts the design of FIG. 1 with the wire 92 of FIG. 1 being replaced by a shorter wire 41 in the X direction, in accordance with embodiments of the present invention. The wire 41 is a test line.

FIG. 8 depicts the design of FIG. 7 after a wire 42, which is a supply line electrically coupled to the current source 30, has been added in the layer 16 as shown, in accordance with embodiments of the present invention. FIG. 8 is essentially the same as FIG. 2 with the wire 42 in FIG. 8 being essentially the same as the wire 22 in FIG. 2; the vias 44 and 45 in FIG. 8 being essentially the same as the vias 24 and 25, respectively, in FIG. 2 and may have any of the various distributions of conductive materials described supra for vias 24 and 25. The intervening dielectric material 43 between wires 41 and 42 in FIG. 8 is essentially the same as the intervening dielectric material 23 between wires 21 and 22, respectively, in FIG. 2. The primary difference between FIG. 8 and FIG. 2 is that in FIG. 2 the wire 22 was formed by removing a portion of the wire 92 of FIG. 1, while in FIG. 8 the wire 42 was formed by adding the new wire 42 in layer 16 without geometrically modifying the wire 41 of FIG. 7. Accordingly, all features and embodiments of FIGS. 2–6 described supra apply to FIG. 8 in the same manner as said features and embodiments apply to FIG. 2.

In FIG. 8, the wire 91 has an effective length $L_1$. In some embodiments, the wire 91 may exist in the X direction only between the outer surfaces of vias 24 and 25 within the effective length $L_1$ such that the wire 91 has a total length that is equal to or less than the effective length $L_1$.

Figure 9:
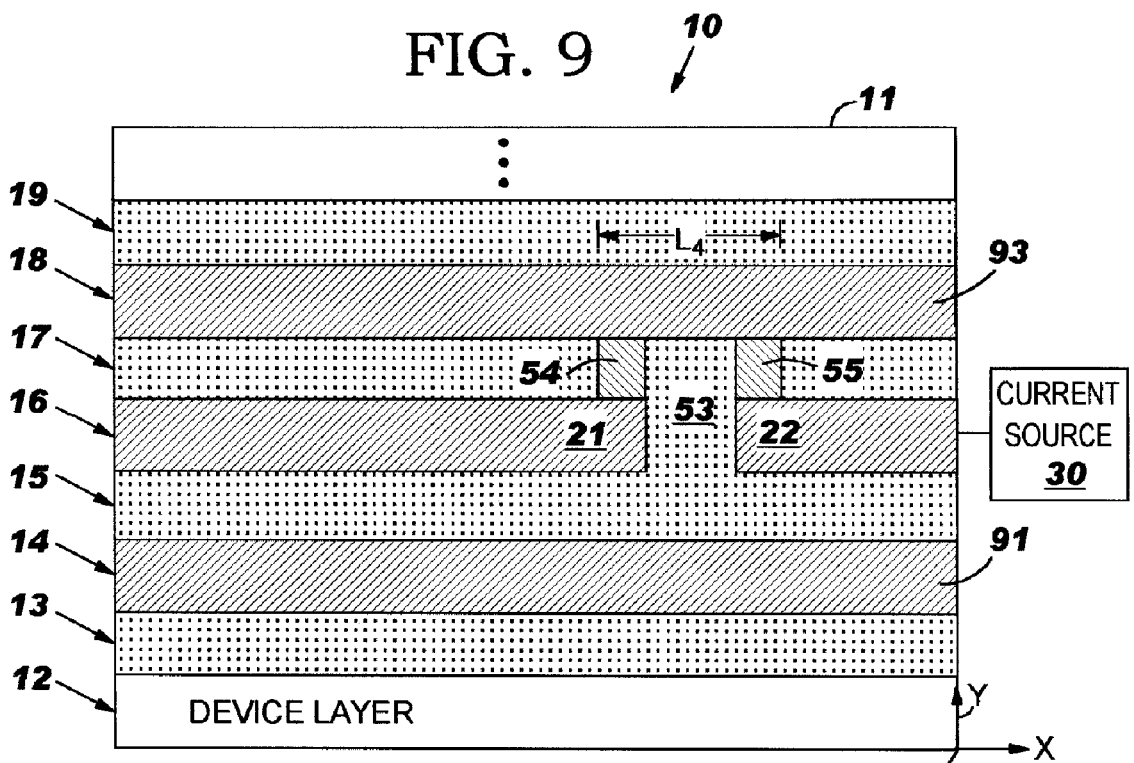
FIG. 9 depicts the design of FIG. 1 after the second wire has been subdivided into a test wire and supply wire, the test wire and supply wire each being coupled by a respective via to the third wire, in accordance with embodiments of the present invention.

FIG. 9 depicts the design of FIG. 1 after removal (in the design process) of a portion of the wire 92, leaving remaining wires 21 and 22 with intervening dielectric material 53 between wires 21 and 22, in accordance with embodiments of the present invention. Wire 21 is a test wire (which may be employed in a test environment or in a product environment as explained supra) and wire 22 is a supply wire electrically connected to the current source 30. Conductive vias 54 and 55 have been added to the design. The vias 54 and 55 may have any of the various distributions of conductive materials described supra for vias 24 and 25 of FIG. 2. The wire 21 is electrically and thermally coupled to the wire 93 by means of via 54, and the wire 22 is electrically and thermally coupled to the wire 93 by means of via 55. Thus, the following electrically conductive and thermally conductive path has been established: wire 22 to via 55 to an effective length of wire 93 to via 54 to wire 21. The effective length of wire 93 is the portion of wire 93 that is within the thermally conductive path from wire 22 to wire 21 and is denoted in FIG. 9 the length $L_4$ in the X direction. In some embodiments, the wire 93 may exist in the X direction only between the outer surfaces of vias 54 and 55 within the effective length $L_4$ such that the wire 93 has a total length that is equal to or less than the effective length $L_4$.

FIG. 9 is similar to FIG. 2 with the primary difference being that the electrical current in layer 93 is being used in FIG. 9 as generating heat and triggering a positive or negative temperature gradient dT(X)/dX in the wire 21, whereas the electrical current in layer 91 is being used in FIG. 2 as generating heat and triggering a positive or negative temperature gradient dT(X)/dX in the wire 21. Accordingly, all features and embodiments of FIGS. 2–8 described supra apply to FIG. 9 in the same manner as said features and embodiments apply to FIG. 2–8. In some embodiments of the present invention characterized by dT/dX<0 along the wire 21, the wire 22 functions as a heat source to the wire 21. In other embodiments of the present invention characterized by dT/dX>0 along the wire 21, the wire 22 functions as a heat sink to the wire 21.

Figure 10:
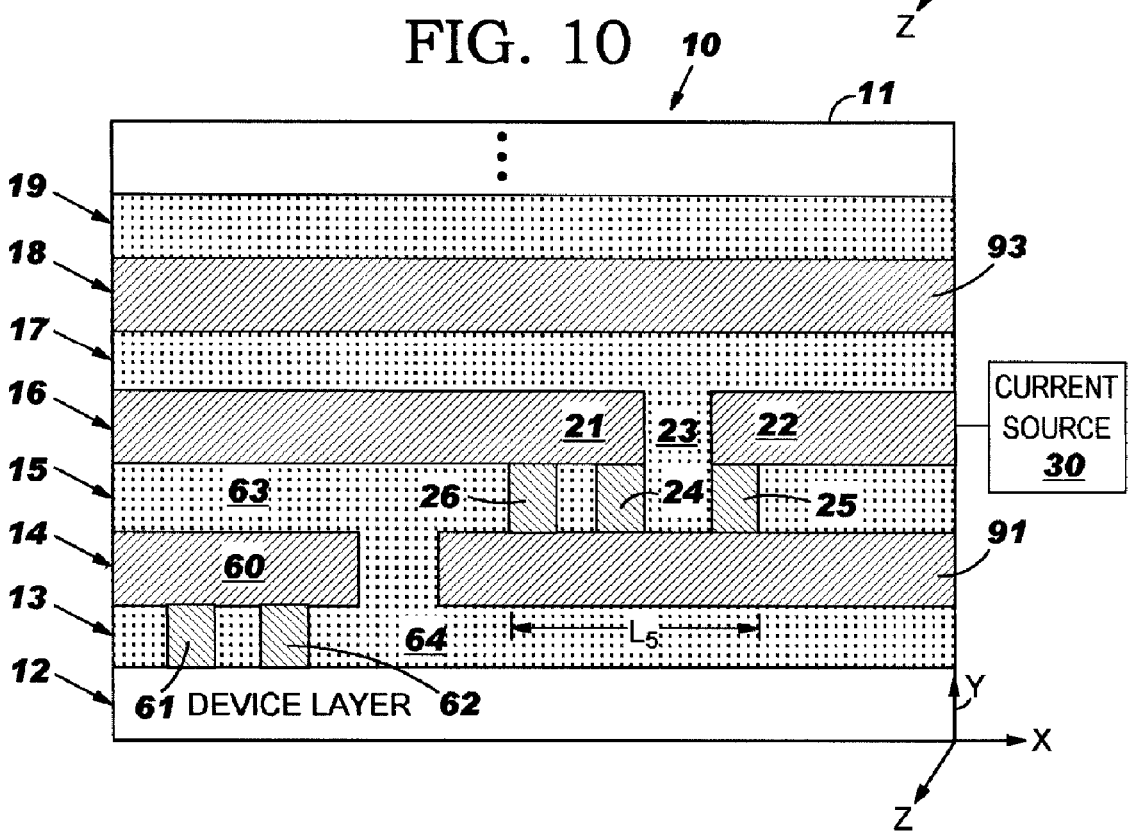
FIG. 10 depicts the design of FIG. 2 with a thermally conductive member added to the left of first wire and thermally coupled to the device layer by one or more thermally conductive vias, in accordance with embodiments of the present invention.

FIG. 10 depicts the design of FIG. 2 with a thermally conductive member 60 added to the left of wire 91 (i.e., in the negative X direction relative to the wire 91) and thermally coupled to the device layer 12 by thermally conductive vias 61 and 62, in accordance with embodiments of the present invention. The thermally conductive member 60 may be a wire, a plate, or other geometric structure. The thermally conductive member 60 is not electrically coupled to any device in the device layer 12 and does not carry an electrical current. The thermally conductive member 60 serves to enhance transfer heat between the wire 21 and the device layer 12 so as to contribute to essentially eliminating or substantially reducing the magnitude of positive or negative temperature gradients dT(X)/dX in the wire 21. The thermally conductive vias 61 and 62 provide a significant enhancement to the thermally conductive heat transfer path between the thermally conductive member 60 and the device layer 12 than the thermal path through the dielectric material 64 alone in the layer 13 in the Y direction. The vias 61 and 62 may have any of the various distributions of conductive materials described supra for vias 24 and 25 of FIG. 2. If the dielectric material 63 in the dielectric layer 15 is thermally insulative, then the dielectric layer 15 should have a sufficiently small thickness (e.g., 0.1–2.0 microns in some applications) in the Y direction to permit adequate conductive heat transfer through the dielectric layer 15 so that a sufficient amount of heat may be transferred between the wire 21 and the device layer 12 to contribute to essentially eliminating or substantially reducing the magnitude of temperature gradients dT(X)/dX in the wire 21. If the thermally conductive member 60 serves to extract heat from the wire 21, then the vias 61 and 62 should be in mechanical contact with a portion of the device layer 12 that does not include active electronic devices; otherwise the active electronic devices may be damaged or made to function incorrectly by the heat extracted from the wire 21 by thermally conductive member 60 and deposited near the active devices. If the thermally conductive member 60 serves to add heat to the wire 21, then the vias 61 and 62 may be placed in mechanical contact with a portion of the device layer 12 that is proximate to active electronic devices in order to utilize the heat dissipated during operation of the active electronic devices.

If the temperature gradients needed to be reduced in the wire 21 exist primarily at the ends of the wire 21 in the X direction (e.g., at the interface between the wire 21 and the via 24 and/or via 26), then use of the thermally conductive member 60 of FIG. 10 to reduce said temperature gradients may be less effective than varying the width of the wire 22 (described supra in conjunction with FIGS. 3A–3C), since use of the thermally conductive member 60 affects the temperature distribution in more centrally located portions along the wire 21 in the X direction.

In FIG. 10, the wire 91 has an effective length $L_5$. In some embodiments, the wire 91 may exist in the X direction only between the outer surfaces of vias 26 and 25 within the effective length $L_5$ such that the wire 91 has a total length that is equal to or less than the effective length $L_5$.

Although FIG. 10 depicts two thermally conductive vias, namely vias 61 and 62, thermally coupling the thermally conductive member 60 to the device layer 12, there may generally be one or more such vias thermally coupling the thermally conductive member 60 to the device layer 12.

Although in FIG. 10 the thermally conductive member 60 is disposed between the wire 21 and the device layer 12, an alternative embodiment has the wire 21 disposed between the thermally conductive member 60 and the device layer 12. In another alternative embodiment, the thermally conductive member 60 is on the same level (in the Z direction) as the wire 21.

FIG. 10 also depicts two vias, namely vias 26 and 24, electrically and thermally coupling the wire 21 to the wire 91. Generally, one or more of such vias may be used to electrically and thermally couple the wire 21 to the wire 91 (in FIGS. 2–6 and 8–9 as well as in FIG. 10). Similarly, one or more electrically and thermally conductive vias may be used to electrically and thermally couple the wire 22 to the wire 91 (in FIGS. 2–6 and 8–9 as well as in FIG. 10). The via 26 may have any of the various distributions of conductive materials described supra for vias 24 and 25.

Figure 11:
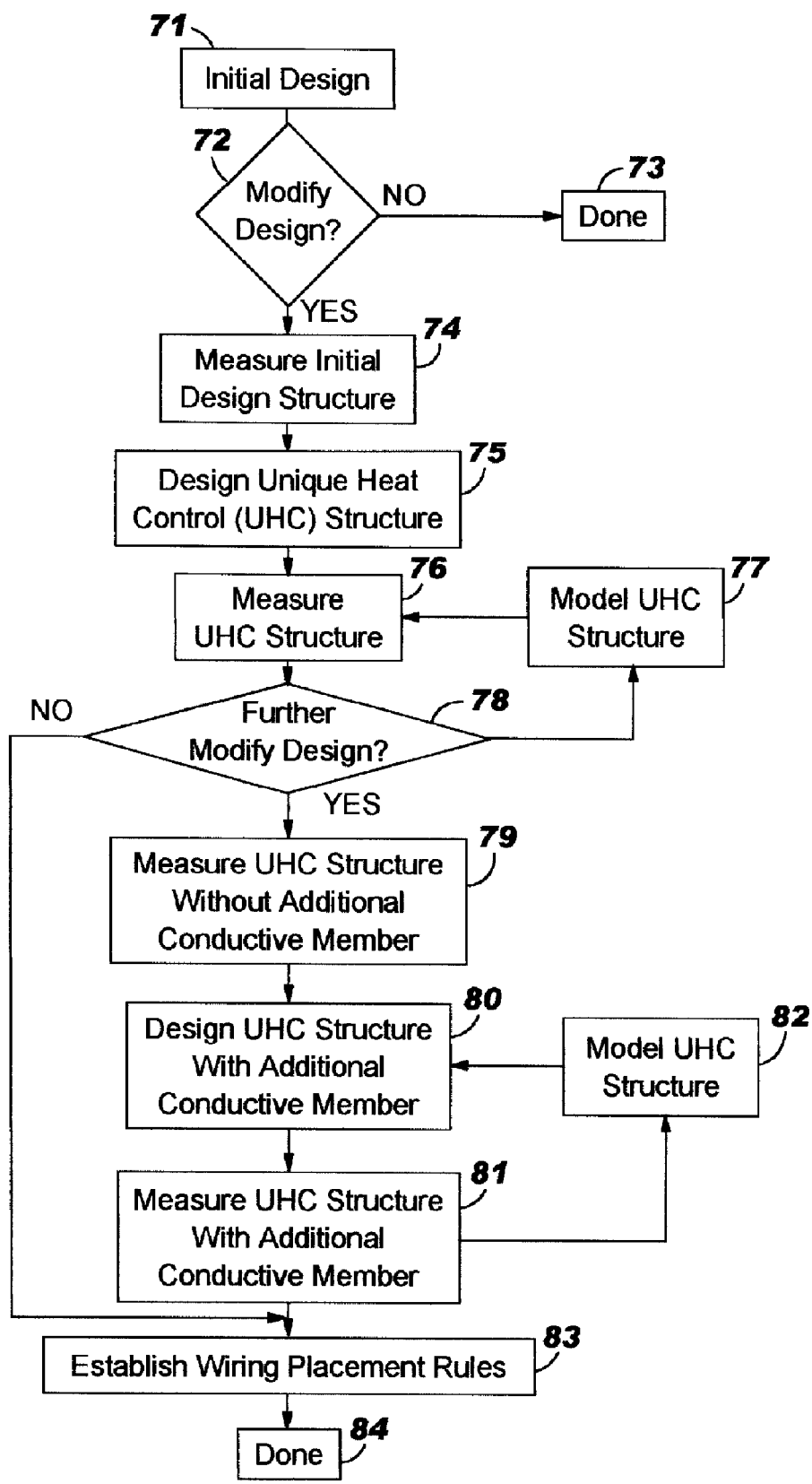
FIG. 11 is a flow chart depicting method steps for effectuating the designs of FIGS. 1–10, in accordance with embodiments of the present invention.

FIG. 11 is a flow chart depicting method steps 71–84 for effectuating the designs of FIGS. 1–10, in accordance with embodiments of the present invention.

Step 71 starts with the initial design corresponding to FIG. 1 or FIG. 7. Step 72 decides whether to modify the initial design. If the decision is made not to modify the initial design, then the method ends at step 73. If the decision is made to modify the initial design, then the method proceeds to step 74.

Step 74 measures, or otherwise determines, electrical, thermal, and geometrical characteristics associated with the initial design structure. Such parameters may include: electrical resistance or resistivity of the test line (i.e., wire 92 in FIG. 1 or wire 41 in FIG. 7), geometry including dimensions of the test line and other wiring, electrical resistivity dependence on temperature, probability distribution of MTF of the test line as a function of temperature and current density, as well as electrical, thermal, and geometrical characteristics of other pertinent aspects of the wiring structure of the substrate 10 (e.g., wire 91). Step 74 may also use a computational tool (e.g., finite element or boundary element simulation) to determine the location of thermal gradients and voids in the test line.

Step 75 alters the initial design in accordance with unique heat control design (UHC) structures depicted in FIGS. 2–6 and 8–9 as discussed supra. In altering the initial design, step 75 assumes a current density in the test line and utilizes the electrical, thermal, and geometrical characteristics associated with the initial design structure obtained from execution of step 74. Step 75 is directed to making the temperature distribution T(X) in the wire 21 of FIGS. 2–6 and 9 (or the wire 41 of FIG. 8) more spatially uniform (i.e., with reduced temperature gradients) for the assumed current density in the test line.

Step 76 determines (through measurement or calculation/simulation) the temperature distribution T(X) in the wire 21 of FIGS. 2–6 and 9 (or the wire 41 of FIG. 8). If the temperature gradient dT(X)/dX, as inferred from T(X) arrived at in step 76, is determined in accordance with an acceptance criterion to be sufficiently small in magnitude to be acceptable, then the method next executes step 78. If dT(X)/dX is not so determined to be sufficiently small in magnitude to be acceptable, then the method next executes step 77 and then iteratively loops through steps 75–77 to re-execute steps 75–77 until dT(X)/dX is determined (in accordance with the acceptance criterion) to be sufficiently small in magnitude to be acceptable. An acceptance criterion may be, inter alia, that the maximum value of |dT(X)/dX| is less than a real positive number, wherein, is a predetermined tolerance for the temperature gradient. The tolerance, may be predetermined to be sufficiently small so as to sufficiently limit dT(X)/dX to prevent or substantially mitigate the adverse effects of electromigration in the wire 21 (e.g., to prevent or substantially reduce the probability of opens or shorts in or proximate to the wire 21) as discussed supra.

In step 77, a thermal model may be used to calculate or predict temperature gradients, voids, MTF, etc. in the test line for the assumed current density of step 75 or for another current density if desired. The thermal model calculations or predictions in step 77 may be based on a simple model such as may be implemented via hand calculations, or on a sophisticated model via a computational tool (e.g., finite element simulation or boundary element simulation).

Step 78 determines whether to further improve the UHC structure by adding one or more conductive members such as the conductive member 60 of FIG. 10. If step 78 determines not to add one or more of such conductive members, then the method proceeds to step 83. If step 78 determines to add one or more of such conductive members, then the method executes steps 79–81.

Step 79 measures, or otherwise determines, electrical, thermal, and geometrical characteristics associated with UHC structure resulting from step 76. Such parameters may include any of the parameters associated with step 74, except that the parameters in step 79 are determined in the context of the UHC structure associated with step 76 whereas the parameters in step 74 are determined in the context of the initial design structure associated with step 71. As in step 74, step 79 may also use a computational tool (e.g., finite element simulation or boundary element simulation) to determine location of thermal gradients and voids in the test line.

Step 80 alters the UHC design structure by adding the one or more conductive members such as the conductive member 60 of FIG. 10. Step 80 is directed to make the temperature distribution T(X) in the wire 21 of FIG. 10 even more spatially uniform (i.e., further diminish the magnitude of the temperature gradients) than exists with the UHC structure resulting from step 76 for the assumed current density in the test line.

Step 81 determines (through measurement or calculation/simulation) the temperature distribution T(X) in the wire 21 of FIG. 10. If the temperature gradient dT(X)/dX, as inferred from T(X) arrived at in step 81, is determined in accordance with an acceptance criterion to be sufficiently small in magnitude to be acceptable, then the method next executes step 83. If dT(X)/dX is not so determined to be sufficiently small in magnitude to be acceptable, then the method next executes step 82 and then iteratively loops through steps 80–82 to re-execute steps 80–82 until dT(X)/dX is determined (in accordance with the acceptance criterion) to be sufficiently small in magnitude to be acceptable. An acceptance criterion may be, inter alia, that the maximum value of |dT(X)/dX| is less than a real positive number # wherein, is a predetermined tolerance for the temperature gradient. The tolerance # may be predetermined to be sufficiently small so as to sufficiently limit dT(X)/dX to prevent or substantially mitigate the adverse effects of electromigration in the wire 21 (e.g., to prevent or substantially reduce the probability of opens or shorts in or proximate to the wire 21) as discussed supra.

In step 82, a thermal model may be used to calculate or predict temperature gradients, voids, MTF, etc. in the test line for the assumed current density of step 80 or for another current density if desired. The thermal model calculations or predictions in step 82 may be based on a simple model such as may be implemented via hand calculations, or on a sophisticated model via a computational tool (e.g., finite element simulation or boundary element simulation).

Step 83 establishes wiring placement rules for the substrate 10, wherein said wiring placement rules reflect the results of step 76 (if steps 79–82 are not executed) or the results of step 81 (if steps 79–82 are executed).

Following step 83, the method ends at step 84.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method for designing wiring in a multilayered substrate so as to limit a temperature gradient in said wiring, comprising the steps of:

providing an initial wiring design in which the multilayered substrate comprises layers stacked in a Y direction, wherein each layer of said layers has its length oriented in a X direction that is orthogonal to the Y direction, wherein a first electrically conductive wire within a first layer of said layers has its length oriented in the X direction, wherein in the initial wiring design the first wire has a spatially nonuniform temperature distribution T(X) along its length for an assumed current density $J_1$ in the first wire such that the first wire has a mean time to failure MTF1 at the current density $J_1$; and altering the initial wiring design to reduce the magnitude of a temperature gradient dT(X)/dX along the length of the first wire for a current density $J_2$ not less than $J_1$ in the first wire, wherein the altering does not include changing a cross sectional area of the first wire, wherein the altering includes electrically and thermally coupling the first wire to a second electrically conductive wire in the first layer by an electrically and thermally conductive structure that exists outside of the first layer and adjusting the width distribution of the second wire in a Z direction that is orthogonal to the X and Y directions, wherein the first and second wires do not physically touch each other, and wherein said adjusting controls a temperature in the second wire so as to cause the second wire to act as a heat source or heat sink to the first wire.

2. The method of claim 1, further comprising the steps of:
following said altering: measuring T(X) along the length of the first wire;
determining in accordance with an acceptance criterion whether dT(X)/dX inferred from the measured T(X) is acceptable; and
if dT(X)/dX is not determined by said determining to be acceptable, then iteratively re-executing the altering, measuring, and determining steps until dT(X)/dX is determined by said determining to be acceptable.

3. The method of claim 1, wherein the first wire is coupled to a current source.

4. The method of claim 1, wherein $J_2$ exceeds $J_1$ and the altering does not essentially change the mean time to failure of the first wire from MTF1.

5. The method of claim 1, wherein $J_2$ is about equal to $J_1$ and the altering changes the mean time to failure of the first wire to MTF2 such that MTF2>MTF1.

6. The method of claim 1, wherein the electrically and thermally conductive structure includes:
a first electrically and thermally conductive via oriented in the Y direction such that the first via is electrically and thermally connected to the first wire;
a second electrically and thermally conductive via oriented in the Y direction such that the second via is electrically and thermally connected to the second wire; and
a third electrically conductive wire in a second layer of said layers, wherein the third wire has its length oriented in the X direction, wherein the second layer is above or below the first layer, and wherein the third wire is electrically and thermally connected to the first and second vias.

7. The method of claim 6, wherein the altering includes removing an intermediate portion of the first wire so as to generate remaining first and second portions of the first wire not physically touching each other, wherein the second portion of the first wire comprises the second wire, and wherein electrically and thermally connecting the first wire to the first via includes electrically and thermally connecting the first portion of the first wire to the first via.

8. The method of claim 6, wherein the second wire is an additional wire that does not comprise any portion of the first wire.

9. The method of claim 6, wherein the second layer is disposed between the first layer and a device layer of the substrate, and wherein the second wire is a heat sink to the first wire at the current density $J_2$ in the first wire.

10. The method of claim 9, wherein the electrical resistivity of the first wire is less than the electrical resistivity of the second wire.

11. The method of claim 6, wherein the first layer is disposed between the second layer and a device layer of the substrate, and wherein the second wire is a heat source to the first wire at the current density $J_2$ in the first wire.

12. The method of claim 11, wherein the electrical resistivity of the first wire exceeds the electrical resistivity of the second wire.

13. The method of claim 6, wherein the altering further includes modifying a width of the third wire in the Z direction.

14. The method of claim 6, wherein the altering further includes modifying a cross sectional area of at least one of the first and second vias.

15. The method of claim 1, wherein the substrate further comprises a device layer, wherein the altering further comprises adding a thermally conductive member in a thermally conductive layer of the substrate, wherein the thermally conductive layer is above or below the first layer, wherein the thermally conductive member and the device layer are thermally coupled to each other by a dielectric layer disposed between the first wire and the thermally conductive member and by at least one thermally conductive via disposed between the thermally conductive member and the device layer, wherein the dielectric layer has a sufficiently small thickness in the Y direction that permits conductive heat transfer through the thickness of the dielectric layer, and wherein the thermally conductive member does not carry an electric current.

16. The method of claim 15, wherein the thermally conductive layer is disposed between the first layer and the device layer.

17. The method of claim 15, wherein the first layer is disposed between the thermally conductive layer and the device layer.

18. The method of claim 15, wherein the at least one thermally conductive via is in mechanical contact with a portion of the device layer that does not include an active electronic device.

* * * * *

UNITED STATES PATENT AND TRADEMARK OFFICE
CERTIFICATE OF CORRECTION

| | | |
|---|---|---|
| PATENT NO. | : 7,096,450 B2 | Page 1 of 1 |
| APPLICATION NO. | : 10/604165 | |
| DATED | : August 22, 2006 | |
| INVENTOR(S) | : Gill et al. | |

It is certified that error appears in the above-identified patent and that said Letters Patent is hereby corrected as shown below:

Column 5
Line 17, delete "$J_2 \# _1$" and insert -- $J_2 \geq J_1$ --

Column 6
Line 54, delete "L1" and insert -- $L_1$ --
Line 62, delete "W1" and insert -- $W_1$ --
Line 62, delete "W0" and insert -- $W_0$ --

Column 8
Line 7, delete "V0" and insert -- $V_0$ --
Line 40, delete "V0" and insert -- $V_0$ --

Column 9
Line 41, delete "$S_3 \# S_1$ and $S_4 \# S_2$" and insert -- $S_3 \leq S_1$ and $S_4 \leq S_2$ --
Line 52, delete "S3 and S4 in relation to S1 and S2" and insert -- $S_3$ and $S_4$ in relation to $S_1$ and $S_2$ --
Line 63, delete "increase" and insert -- reduce --
Line 64, delete "S4" and insert -- $S_4$ --

Column 14
Line 10, delete "number # wherein, is" and insert -- number $\epsilon$ wherein $\epsilon$ is --
Line 12 delete "tolerance # may" and insert -- tolerance $\epsilon$ may --

Signed and Sealed this

Twelfth Day of June, 2007

JON W. DUDAS
*Director of the United States Patent and Trademark Office*

UNITED STATES PATENT AND TRADEMARK OFFICE
CERTIFICATE OF CORRECTION

PATENT NO. : 7,096,450 B2 Page 1 of 1
APPLICATION NO. : 10/604165
DATED : August 22, 2006
INVENTOR(S) : Gill et al.

It is certified that error appears in the above-identified patent and that said Letters Patent is hereby corrected as shown below:

Column 6
Line 64, delete "W1>W0" and insert -- $W_1 > W_0$ --

Signed and Sealed this

Sixth Day of May, 2008

JON W. DUDAS
*Director of the United States Patent and Trademark Office*